United States Patent [19]

Schöffel

[11] Patent Number: 5,194,829
[45] Date of Patent: Mar. 16, 1993

[54] RADIO SET WITH EASILY SELECTED OSCILLATOR FREQUENCY

[75] Inventor: Peter Schöffel, Kirchrüsselbach, Fed. Rep. of Germany

[73] Assignee: U.S. Philips Corporation, New York, N.Y.

[21] Appl. No.: 755,386

[22] Filed: Sep. 5, 1991

[30] Foreign Application Priority Data

Sep. 8, 1990 [DE] Fed. Rep. of Germany ....... 4028565

[51] Int. Cl.[5] .......................... H03L 7/18; H04B 1/06
[52] U.S. Cl. ..................................... 331/1 A; 331/16; 455/260; 455/182.2; 455/183.1
[58] Field of Search ..................... 331/1 A, 16, 18, 25; 455/260, 182.1, 182.2, 183.1

[56] References Cited

U.S. PATENT DOCUMENTS

| | | | |
|---|---|---|---|
| 3,898,579 | 8/1975 | Aldridge | 331/16 X |
| 4,654,859 | 3/1987 | Kung et al. | 331/1 A X |
| 4,816,774 | 3/1989 | Martin | 331/16 X |

FOREIGN PATENT DOCUMENTS

| | | |
|---|---|---|
| 009617 | 4/1980 | European Pat. Off. . |
| 2552177 | 6/1977 | Fed. Rep. of Germany . |
| 60-058711 | 4/1985 | Japan . |
| 2-2085812 | 11/1990 | Japan . |

Primary Examiner—David Mis
Attorney, Agent, or Firm—David R. Treacy

[57] ABSTRACT

The divider of the phase locked loop, which control transmitting or receiving frequency, is set to a selected one of a plurality of pre-set values. The selected channel number is entered into one of a bank of registers. The other registers are too short to store the entire binary number corresponding to the lowest division ratio. The lowest division ratio is obtained by concatenating the binary numbers stored in two or more of the registers, and the channel number is then added by binary addition.

10 Claims, 1 Drawing Sheet

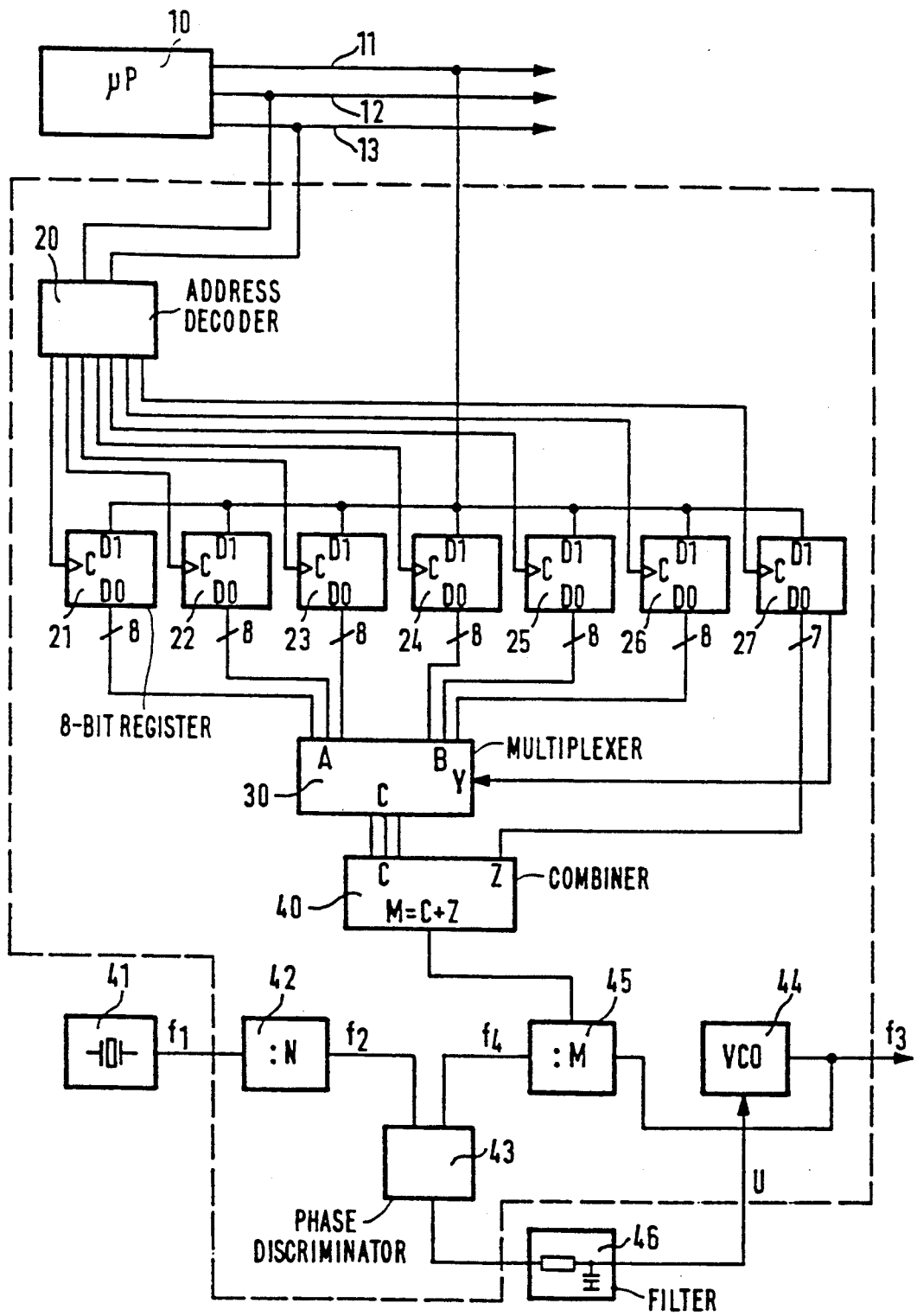

RADIO SET WITH EASILY SELECTED OSCILLATOR FREQUENCY

BACKGROUND OF THE INVENTION

The invention relates to a radio set comprising an oscillator with a phase-locked loop, and at least a divider incorporated in the phase-locked loop, to which divider a binary value can be applied for setting a variable division ratio.

Phase-locked loops (PLL) are used for follow-up synchronization, for synchronizing the frequency of an oscillator so that it is phase-locked to a reference frequency. For this purpose, the oscillator is readjusted so that a predetermined phase relation is maintained between the two clocks. Instead of the direct comparison between the oscillator and the reference clock, also clocks derived through a division are often used. By properly selecting the division ratios, different output frequencies of the oscillator can be synchronized in this manner. Phase locked loops of this type are chiefly used in radio sets wherein they are used for synchronizing the frequencies of different channels.

U.S. Pat. No. 4,654,859 discloses an oscillator with a phase-locked loop, wherein a programmable divider arranged in the phase-locked loop is connected to a microprocessor over data lines. The division ratio necessary for each output frequency is accordingly set in the programmable divider by means of the microprocessor.

Since a divider can be programmed, one is extremely free to select the output frequencies. However, division ratios for whose representation a large number of binary positions are necessary are often to be employed.

SUMMARY OF THE INVENTION

It is an object of the invention to provide a phase-locked loop of the type mentioned in the preamble so that frequency changes during the operation of the oscillator can easily be realised.

This object is achieved in that a bank of registers for data supply is provided which is coupled to the divider through a combiner including an adder.

In this manner the word length of the individual registers can be selected smaller than the number of positions necessary for representing the selected division ratio. Cascading (Concaterating) of registers may produce a first binary value, to which a second binary value can be added. The sum of the two binary values then represents the division ratio concerned. In an advantageous manner the binary values of the individual registers can be selected so that only the contents of a single register are to be changed when another frequency is switched to. This is advantageous in that the reprogramming for obtaining a new division ratio can be restricted, for example, to only a single register and can thus be effected more rapidly than the renewed programming of a new division ratio.

Especially in radio systems in which a plurality of radio channels are selected to have a fixed channel spacing, the invention makes it possible, once a specific basic division ratio has been programmed once, for example, each time the radio set is switched on, to synchronize the output frequency of the oscillator with the output frequency necessary for the specific channel number. This also reduces the internal circuitry for converting channel numbers into division ratios inside the radio set. A change of channel can thus be effected more rapidly.

In a further arrangement of the invention a multiplexer is inserted between the registers and the combiner. With the aid of the multiplexer there can be switched between two different division ratios, for example, for transmitter and receive frequencies. Irrespective of the programming of the register, which register is used for frequency synchronization, the difference between the two oscillator output frequencies, which can be selected by means of the multiplexer, always remains constant. In this manner the frequency necessary for the receive or transmit sections respectively, can be obtained without any additional programming costs in the above radio systems, in which there are constant frequency spacings between the receive and transmitter frequencies for all the channels only in that the channel numbers are reprogrammed after the multiplexer has accordingly been switched over. The number of data to be exchanged are thus restricted to the bare minimum.

The invention will now be further described and explained with reference to an embodiment.

BRIEF DESCRIPTION OF THE DRAWING

The single FIGURE shows an oscillator with a phase-locked loop which comprises a programmable divider.

DESCRIPTION OF THE PREFERRED EMBODIMENT

In the embodiment the oscillator with the phase-locked loop is installed in a radio receiver to produce a first mixing frequency for radio signal reception or to produce a transmitter frequency to be applied to a transmitter modulator. The radio receiver is used in a radio system in which 124 radio channels are used having a 200 kHz channel spacing. The lowest mixing frequency corresponding to the receive channel 1 is 935.2 MHz. The lowest transmitter frequency corresponding to the transmit channel 1 is fixed at 890.2 MHz.

A reference clock oscillator 41 produces a reference clock $f_1$ which is divided into a second frequency $f2$ by means of a first divider 42 dividing by the factor of N. In the embodiment the division factor N is selected so that the derived reference frequency $f2$ resulting from the division exactly corresponds to the channel spacing between two adjacent receive or transmit channels. With a selected reference clock of 13 MHz and a channel spacing of 200 kHz the division factor N is thus equal to 65.

A voltage-controlled oscillator (VCO) 44 produces an output frequency $f3$ which is applied to a programmable divider 45. The VCO output frequency $f4$ resulting from the division by a factor M is applied to a phase discriminator 43 as is the divided reference frequency $f2$. By means of a low-pass filter 46 the phase discriminator 43 produces a control voltage U proportional to the phase deviation, which voltage is applied to the voltage-controlled oscillator 44 and determines its output frequency $f3$ in accordance with the equation:

$$f3 = \frac{M}{N} \times f1 \tag{1}$$

The division ratio M can be selected in accordance with the desired output frequency of the voltage-controlled oscillator 44. For this purpose, a bank of seven registers 21 to 27 is connected to a data bus 11 of a microprocessor 10. An address decoder 20 is further connected to an address bus 12 and a control bus 13 of the microprocessor 10. Separate control lines for each register lead from the address decoder 20 to control inputs of the registers. A specific address is assigned to each of the registers 21 to 27 by means of the address decoder 20. If the address decoder 20 detects an address assigned to one of the registers 21 to 27, it produces an accept signal on the control line leading to the register concerned. In this manner the microprocessor 10 can selectively write an eight-bit binary word in any of the registers 21 to 27. The data of these binary words can be transferred in words (for example, 8-bit long data words) and serially (for example, over an I²C bus) depending on the bus architecture used.

In the embodiment the registers are arranged so that a 24-bit binary word A can be represented by means of the register contents of the first three registers 21, 22, 23, which binary word A is used for forming the division factor M for the mixing frequency of the receive section. The next three registers 24, 25, 26 are used for representing a 24-bit binary value B from which the division factor M for the transmitter frequency is derived. A selection can be made between these two binary words A and B by means of a multiplexer 30. The selected binary word C is applied to a combiner 40. The seven least significant bits of the seventh register 27 are also applied to the combiner 40 as a channel selection word Z. The 24-bit selected binary word C and the 7-bit channel selection word Z are added together in the adder portion of the combiner 40 and in this manner the division factor M for the programmable divider 45 is obtained. The selection between the two 24-bit binary values A and B is made with the remaining most significant eighth bit Y of the seventh register 27. This bit Y is applied to a control input of the multiplexer 30.

According to the state of the control bit Y a mixing frequency f3 is thus obtained which corresponds to the equation:

$$f3 = f1 \frac{A + Z}{N} \quad (2)$$

or a transmitter frequency $$f3 = f1 \frac{B + Z}{N} \quad (3)$$

In the embodiment in which the lowest mixing frequency f3 for a channel number 1 is situated at 935.2 MHz, the decimal numerical value 4,675 can be designated for the first binary word A while considering the reference frequency selected to be 200 kHz and the channel selection word Z=1. This value can be loaded into the first three registers 21, 22, 23. With a transmitter frequency of 890.2 MHz for a transmission channel 1, the second binary value B to be loaded into the second three registers 24, 25, 26 can be selected to be equal to the digital numerical value 4,450. More than eight bits are necessary for the binary representation of these division ratios, whereas only 7-bit binary numbers are necessary for representing 124 channels.

In the embodiment the registers 21 to 27 are arranged as RAM building blocks so that they can be reprogrammed as often as one likes. This increases the flexibility of the described arrangement. For this purpose, however, it is necessary that first the 24-bit binary values A and B are preprogrammed when the radio receiver is switched on. For a change of channels only the contents of the seventh register 27 need to be changed.

An even greater flexibility is obtained in that also the division ratio N of the first divider can be programmable. As a result, not only the transmitter and receive frequencies can be changed, but also the channel spacing. Applications in which, for example, the first six registers 21 to 26 are arranged as ROMs and only the contents of the seventh register can be changed are also considered to be within the scope of this invention.

It is especially advantageous to combine the address decoder 20, the registers 21 to 27, the multiplexer 30, the adder combiner 40 together with parts of the phase-locked loop, for example, the first divider 42 and the programmable divider 45 as well as the phase discriminator 43 and the voltage controlled oscillator 44 on a single integrated circuit. In that case a highly universally applicable switching circuit will be obtained for a phase-locked loop which can be used for many purposes.

I claim:

1. A radio set comprising an oscillator with a phase-locked loop, and at least one divider incorporated in said loop, said divider comprising means for applying a binary value for setting a variable division ratio, said ratio being selectable as a value requiring a given number of binary digits to represent said value, characterized in that said means for applying consists of:

a bank of binary registers each having a length less than said given number, means for storing respective binary numbers in each of said registers, a concatenator, having an output, for selectively combining the binary numbers stored in a plurality of said registers, an adder having an output, for adding at least a first portion of the binary number in a first of said registers to said concatenator output, said adder output being said division ratio, and a multiplexer controlling said concatenator.

2. A set as claimed in claim 1, characterized in that said multiplexer is responsive to at least a second portion of the binary number in one of said registers.

3. A set as claimed in claim 2, characterized in that said first of said registers is said one register, said first and second portions being mutually exclusive portions of said one register.

4. A set as claimed in claim 3, characterized in that said second portion is the most significant digit in said one register.

5. A set as claimed in claim 3, characterized in that said multiplexer controls said concatenator to concatenate binary numbers stored in fewer than half of said bank of registers.

6. A radio set comprising an oscillator with a phase-locked loop, and at least one divider incorporated in said loop, said divider comprising means for applying a binary value for setting a variable division ratio, said ratio being selectable as a value requiring a given number of binary digits to represent said value, characterized in that said means for applying consists of:

a bank of binary registers each having a length less than said given number, means for storing respective binary numbers in each of said registers, means for deriving a derived binary number from at least a first of said registers, an adder having an output, for adding at least a first portion of the binary number in a second of said registers to said derived binary number, said adder output being said division ratio, and a multiplexer, responsive to at least a second portion of the binary number in one of said registers, controlling said means for deriving.

7. A set as claimed in claim 6, characterized in that said second of said registers is said one register, said first and second portions being mutually exclusive portions of said one register.

8. A set as claimed in claim 7, characterized in that said second portion is the most significant digit in said one register.

9. A set as claimed in claim 8, characterized in that said first portion is a selected channel number, and said second portion indicates selection of a transmitting or a receiving mode.

10. A set as claimed in claim 9, characterized in that said means for deriving is a concatenator for concatenating binary numbers stored in fewer than half of said bank of registers.

* * * * *